United States Patent
Wong et al.

(10) Patent No.: US 6,771,543 B2
(45) Date of Patent: Aug. 3, 2004

(54) PRECHARGING SCHEME FOR READING A MEMORY CELL

(75) Inventors: Keith Wong, San Jose, CA (US); Pau-Ling Chen, Saratoga, CA (US); Michael S. Chung, San Jose, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/226,912

(22) Filed: Aug. 22, 2002

(65) Prior Publication Data

US 2004/0037137 A1 Feb. 26, 2004

(51) Int. Cl.[7] .............................................. G11C 16/06
(52) U.S. Cl. ............................ 365/185.25; 365/185.17; 365/203
(58) Field of Search ..................... 365/185.25, 185.17, 365/203

(56) References Cited

U.S. PATENT DOCUMENTS 6,081,456 A * 6/2000 Dadashev .............. 365/185.23
6,088,265 A * 7/2000 Ohta ..................... 365/185.16
6,487,124 B2 * 11/2002 Semi ..................... 365/185.25

* cited by examiner

Primary Examiner—Hoai Ho

(57) ABSTRACT

A method of reading a memory cell, and a memory array using the method, are described. An electrical load is applied to a first node in the memory array, the first node corresponding to the memory cell. A second node in the memory array, the second node on a same word line as the first node, is precharged. The second node is separated from the first node by at least one intervening node in the same word line.

15 Claims, 5 Drawing Sheets

Dots such as this dot are added to show connections between memory cells and bit lines/word lines in a memory array.

PRECHARGING SCHEME FOR READING A MEMORY CELL

TECHNICAL FIELD

The present claimed invention generally relates to an array of memory cells. More specifically, the present claimed invention relates to virtual ground architecture memory arrays.

BACKGROUND ART

The architecture of a typical memory array is known in the art. Generally, a memory array includes a number of lines arranged as rows and columns. The rows of the array are commonly referred to as word lines and the columns as bit lines, although it is understood that such terminology is relative.

The word lines and bit lines overlap at what can be referred to as nodes. Situated at or near each node is a memory cell, which is generally some type of transistor. In a virtual ground architecture, a bit line can serve as either a source or drain line for the transistor (memory cell), depending on which memory cell is being program verified or read. For simplicity of discussion, a "read" can refer to either a read operation or a program verification operation.

When reading a selected memory cell, a core voltage is applied to the word line corresponding to that cell, and the bit line corresponding to that cell is connected to a load (e.g., a cascode or cascode amplifier). Because of the architecture of the memory array, all of the memory cells on the word line are subject to the core voltage. This can induce a leakage current along the word line, in effect causing an unwanted interaction between the memory cells on the word line. The leakage current, if of sufficient magnitude, can slow down the read and also cause errors in reading the selected memory cell.

To minimize the interaction among memory cells on a word line and to speed up the read, a technique commonly referred to as precharging is used. Precharging works by charging (applying an electrical load) to the node next to the node that corresponds to the memory cell being read. Specifically, the node next to (and on the same word line) as the drain node of the selected memory cell is precharged. If the drain node and the precharge node are at about the same voltage, then the precharge has the effect of reducing the leakage current.

A problem with precharging is that it is difficult to predict the voltage that needs to be applied to the precharge node. It is important to apply an appropriate precharge voltage because, if the precharge voltage is set too high or too low, the memory cell may not be properly read. However, there are many factors that can influence the amount of leakage current and hence the amount of voltage that should be applied to the precharge node. These factors include variations in temperature and in the supply voltage. In addition, a relatively new memory architecture, referred to as a mirror bit architecture, is coming into use. In a contemporary mirror bit architecture, two bits can be stored per memory cell, as opposed to the single bit that is conventionally stored in a memory cell. The pattern of bits (e.g., 00, 01, 10 or 11) stored in a mirror bit memory cell can also influence the amount of leakage current. Thus, estimating the proper amount of precharge voltage can be difficult and may be even more difficult for mirror bit architectures.

In summary, reading memory cells according to prior art techniques can be problematic if the precharge voltage is not properly selected; however, selecting the proper precharge voltage is difficult because of the factors involved. Accordingly, a technique for reading memory cells that addresses the problems of the prior art would be useful.

DISCLOSURE OF THE INVENTION

A method of reading a memory cell, and a memory array using the method, are described in various embodiments. In one embodiment, an electrical load is applied to a first node (or bit line) in a memory array, the first node corresponding to a memory cell. A second node (or bit line) in the memory array, the second node on a same word line as the first node, is precharged. The second node is separated from the first node by at least one intervening node in the same word line. In one embodiment, the second node is in the range of two to five nodes from the first node.

In one embodiment, the memory cell utilizes a mirror bit architecture wherein two bits of data are stored in the memory cell.

In another embodiment, a third node in the memory array is precharged, so that multiple nodes on the word line are precharged.

BRIEF DESCRIPTION OF THE DRAWINGS

The accompanying drawings, which are incorporated in and form a part of this specification, illustrate embodiments of the invention and, together with the description, serve to explain the principles of the invention.

The drawings referred to in this description should be understood as not being drawn to scale except if specifically noted.

BEST MODES FOR CARRYING OUT THE INVENTION

In the following detailed description of the present invention, numerous specific details are set forth in order to provide a thorough understanding of the present invention. However, it will be recognized by one skilled in the art that the present invention may be practiced without these specific details or with equivalents thereof. In other instances, well-known methods, procedures, components, and circuits have not been described in detail as not to unnecessarily obscure aspects of the present invention.

Some portions of the detailed descriptions which follow are presented in terms of procedures, steps, logic blocks, processing, and other symbolic representations of operations on data bits that can be performed on computer memory. These descriptions and representations are the means used by those skilled in the data processing arts to most effectively convey the substance of their work to others skilled in the art. A procedure, computer executed step, logic block, process, etc., is here, and generally, conceived to be a self-consistent sequence of steps or instructions leading to a desired result. The steps are those requiring physical manipulations of physical quantities. Usually, though not necessarily, these quantities take the form of electrical or magnetic signals capable of being stored, transferred, combined, compared, and otherwise manipulated in a computer system. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the following discussions, it is appreciated that throughout the present invention, discussions utilizing terms such as "applying" or "precharging" or the like, refer to the action and processes of a computer system (e.g., flowchart 400 of FIG. 4), or similar electronic computing device, that manipulates and transforms data represented as physical (electronic) quantities within the computer system's registers and memories into other data similarly represented as physical quantities within the computer system memories or registers or other such information storage, transmission or display devices.

Figure 1:
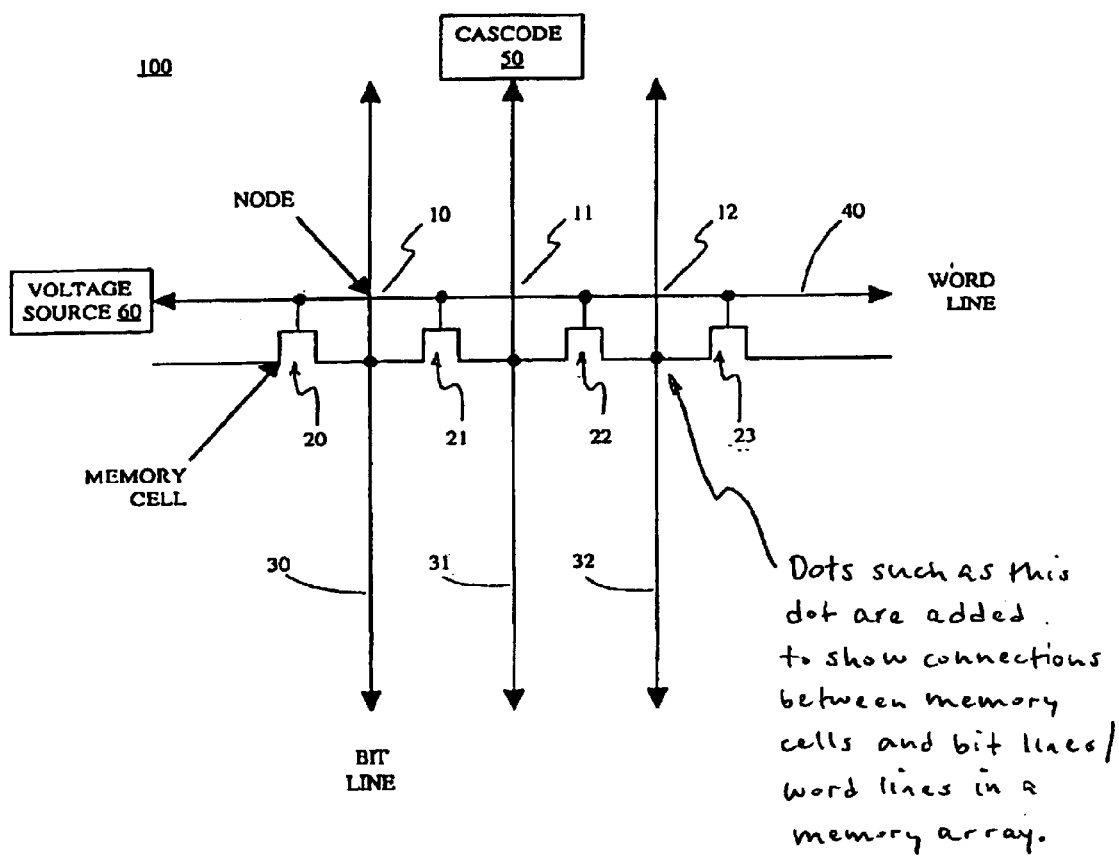
FIG. 1 is a representation of a portion of a memory array according to one embodiment of the present invention.

FIG. 1 is a representation of a portion of a memory array 100 according to one embodiment of the present invention. In FIG. 1, for simplicity of discussion and illustration, a single word line 40 and a number of bit lines 30, 31 and 32 are illustrated. However, it is understood that a memory array may actually utilize a different number of word lines and bit lines. That is, memory array 100 will in actuality extend further to the left and right and also horizontally and vertically (left, right, horizontal and vertical being relative directions). It is also understood that only certain elements of a memory array are illustrated; that is, a memory array may actually include elements other than those shown. For example, in one embodiment, memory array 100 utilizes a virtual ground architecture. In a virtual ground architecture, a bit line can serve as either a source or drain, depending on the memory cell being read (or program verified).

Couplable to word line 40 is a power supply (voltage source 60), while couplable to each bit line 30–32 is a load (exemplified by cascode 50). The bit lines 30–32 are substantially parallel to each other, and word line 40 is substantially orthogonal to the bit lines. The word line 40 and the bit lines 30–32 overlap at a number of nodes 10, 11 and 12, respectively. Corresponding to each of these nodes is a memory cell 20, 21 and 22. That is, in this embodiment, memory cell 20 corresponds to node 10, memory cell 21 corresponds to node 11, and memory cell 22 corresponds to node 12. Also illustrated is a memory cell 23, corresponding to another node (not shown). The memory cells 20–23 may be a single bit memory cell such as memory cell 200 of FIG. 2A, or a mirror bit memory cell such as memory cell 250 of FIG. 2B.

The memory cells 20–23 are each connected to two adjoining bit lines and to a word line in memory array 100. For example, memory cell 21 is connected to bit lines 30 and 31 and to word line 40.

Figure 2A:
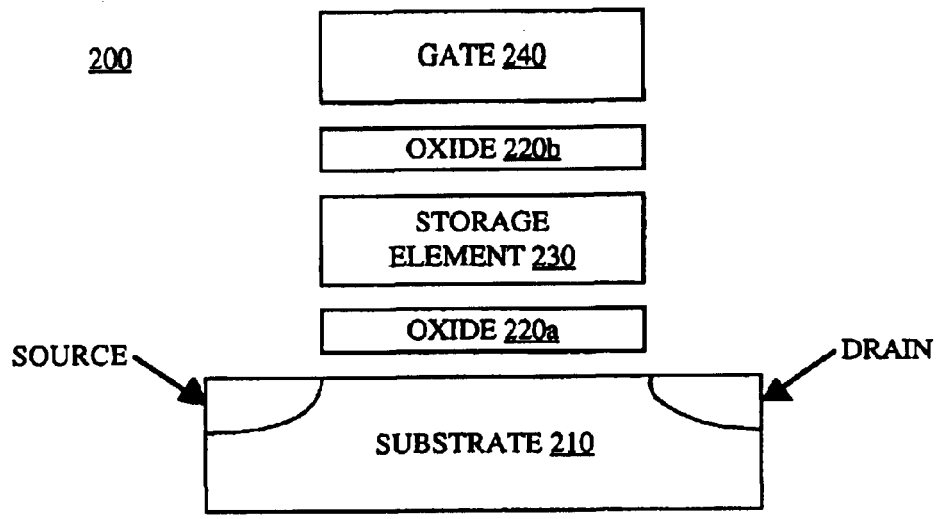
FIG. 2A is a representation of an exemplary memory cell according to one embodiment of the present invention.

FIG. 2A is a representation of an exemplary memory cell 200 according to one embodiment of the present invention. In this embodiment, memory cell 200 is a floating gate memory cell that includes a substrate 210 in which source and drain regions are formed. Typically, memory cell 200 also includes a first oxide layer 220a, a storage element 230 (e.g., a floating gate), a second oxide layer 220b, and a control gate 240. In this embodiment, storage element 230 is used for storing a single bit. Memory cells such as memory cell 200 are known in the art.

Figure 2B:
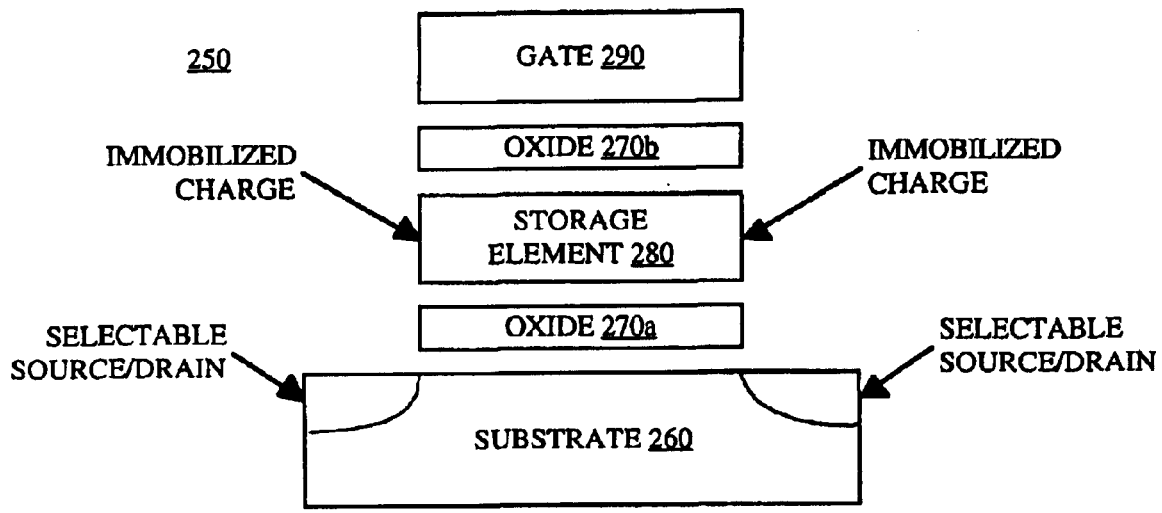
FIG. 2B is a representation of an exemplary mirror bit memory cell according to one embodiment of the present invention.

FIG. 2B is a representation of an exemplary mirror bit memory cell 250 according to one embodiment of the present invention. In this embodiment, memory cell 250 includes a substrate 260, a first oxide layer 270a, a storage element 280 (e.g. a floating gate), a second oxide layer 270b, and a control gate 290. Unlike memory cell 200 of FIG. 2A, which is based on an asymmetric transistor with a distinct source and a distinct drain, memory cell 250 is based on a symmetric transistor with similar (selectable) source and drain. Also, mirror bit memory cell 250 is configured to allow a bit to be stored on either or both sides of storage element 280. Specifically, once electrons are stored on one side of storage element 280, they remain on that side and do not migrate to the other side of the storage element. Thus, in the present embodiment, two bits can be stored per memory cell.

Figure 3A:
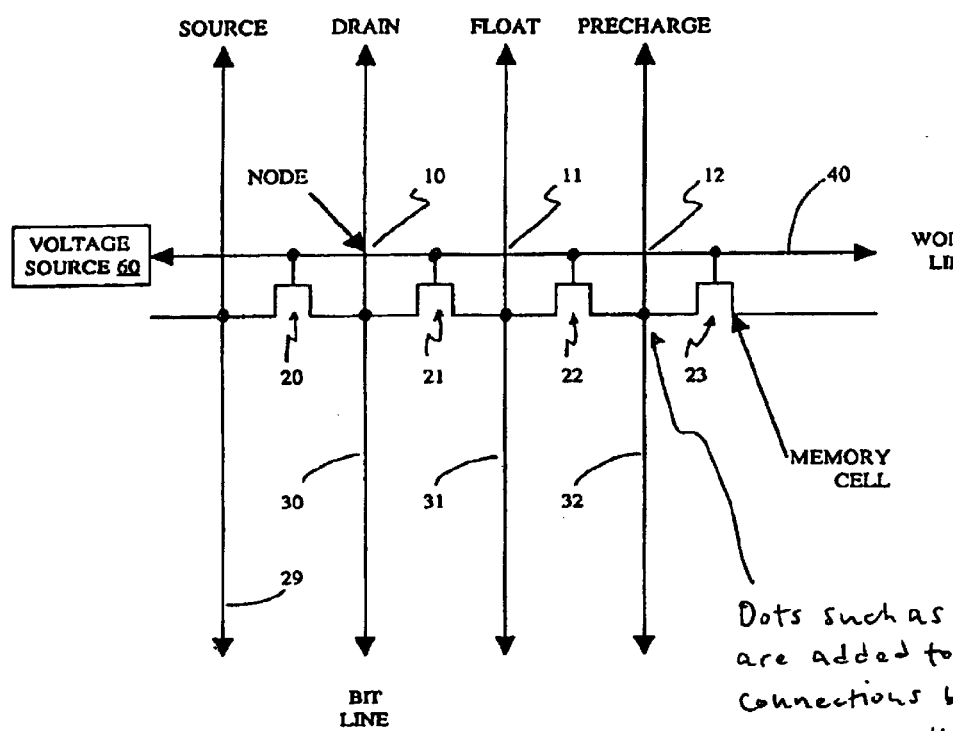
FIG. 3A illustrates one embodiment of a precharge scheme according to the present invention.

FIG. 3A illustrates one embodiment of a precharge scheme according to the present invention. In this embodiment, a bit line (e.g., bit line 32) that is at least one bit line removed from the drain bit line (e.g., bit line 30) is precharged. That is, according to the present embodiment of the present invention, there is at least one intervening bit line (e.g., bit line 31) between the drain bit line and the precharge bit line. It is appreciated that, although the precharge bit line is illustrated as being in one direction relative to the drain bit line, the precharge bit line may be in either direction along word line 40.

The precharge scheme of FIG. 3A is implemented as follows for a read or for program verification of a selected memory cell (e.g., memory cell 20). (For simplicity of discussion herein, a read can refer to either a read operation or a program verification operation.) For a read of memory cell 20, bit line 29 serves as the source bit line and bit line 30 serves as the drain bit line. An electrical load (e.g., a cascode) is applied to node 10 (bit line 30) corresponding to memory cell 20. To reduce leakage current, bit line 32, which is separated from bit line 30 (node 10) by at least one intervening bit line (or node), is precharged. In one embodiment, the precharge voltage is in the range of approximately 1.2 to 1.4 volts; however, other precharge voltages may be used. For example, precharge voltages of 1.5 volts are contemplated. In general, the precharge voltage is matched as closely as practical to the electrical load on the drain node (e.g., node 10). Other factors that can influence the amount of the precharge voltage include the sensing scheme to be implemented and the effect of the sensing scheme on the design of the cascode and other peripheral circuits.

In other embodiments, a bit line further removed from bit line 30 can be precharged. In other words, a bit line separated from bit line 30 by more than one (e.g., by two or more) bit lines or nodes can be precharged as an alternative to precharging bit line 32. It is recognized that there is a limitation to how far the precharge bit line may be from the drain bit line. There are at least two factors to consider when selecting the distance between the drain bit line and the precharge bit line. One factor to consider is that, as the precharge bit line is moved further from the drain bit line, the effect of the precharge bit line on the selected node will be reduced. Thus, precharging a bit line too distant from the selected mode may not have a significant enough effect on the leakage current. The other factor to consider is the architecture of the memory array. For example, in a mirror bit architecture, memory cells are read (decoded) in groups of four. This can place a limitation on the distance between the drain bit line and the precharge bit line. Based on these factors, distances of up to five bit lines (nodes) between the precharge bit line and the drain bit line are contemplated. However, it is appreciated that application of the features of the present invention, in all of its embodiments, is not limited to a distance of five bit lines (nodes) between drain and precharge bit lines.

Figure 3B:
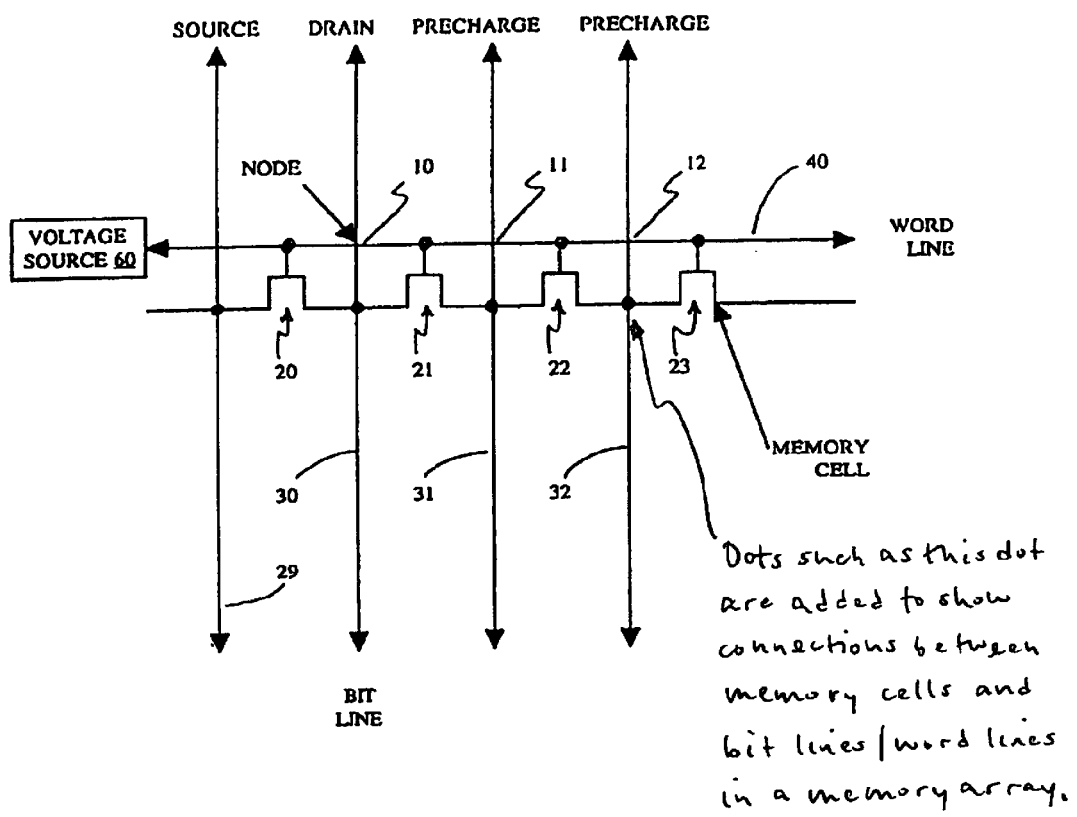
FIG. 3B illustrates another embodiment of a precharge scheme according to the present invention.

FIG. 3B illustrates another embodiment of a precharge scheme according to the present invention. In this embodiment, multiple bit lines (e.g., bit lines 31 and 32) or nodes (e.g., nodes 11 and 12) are precharged. Note that, in a broad sense, at least one of the precharge bit lines is separated from the drain bit line by an intervening bit line (node).

In alternative embodiments, other precharge schemes may be used. For example, more than two bit lines may be precharged. Also, non-consecutive bit lines may be precharged. Furthermore, when multiple bit lines are precharged, each of the precharge bit lines may be separated from the selected node by one or more intervening nodes or bit lines. In addition, with multiple precharge bit lines, bit lines on each side of the selected node may be precharged. Again, in a broad sense, at least one of the precharge bit lines is separated from the selected node by an intervening node (or bit line).

In one embodiment in which multiple bit lines are precharged, the same precharge voltage is applied to each bit line. In another such embodiment, different precharge voltages may be applied to one or more of the precharge bit lines.

Figure 4:
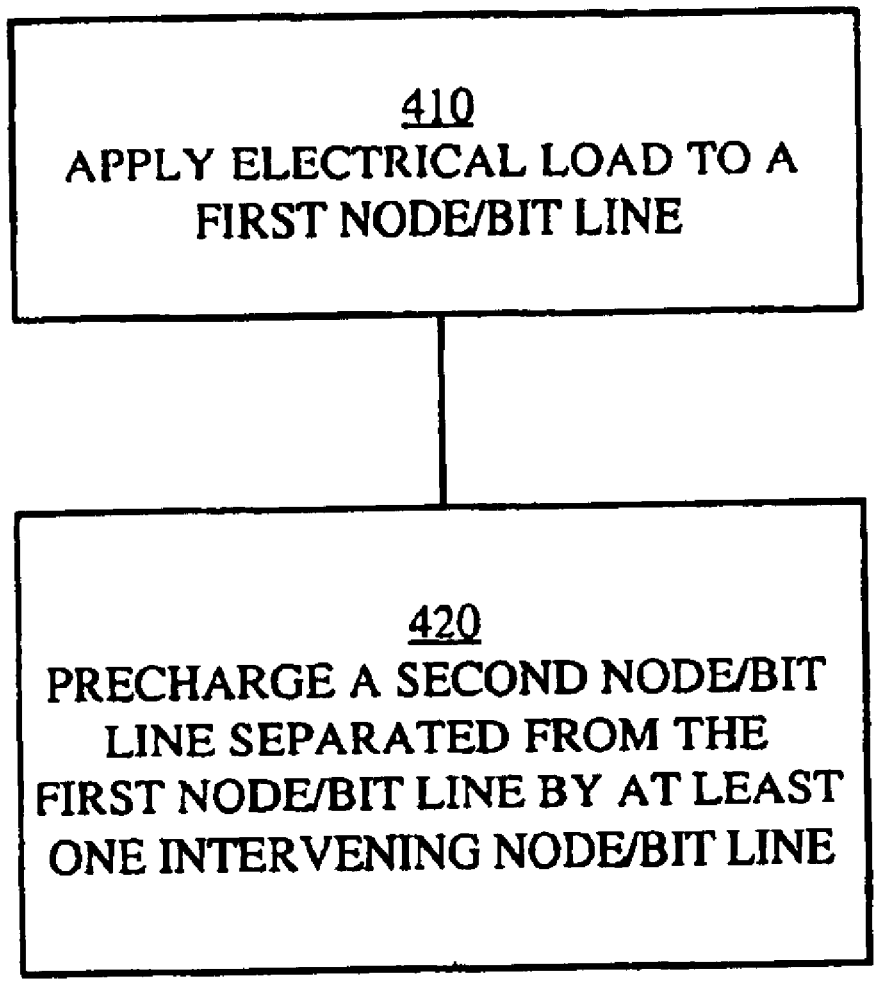
FIG. 4 is a flowchart of a method of reading a memory cell according to one embodiment of the present invention.
Figure 3A:
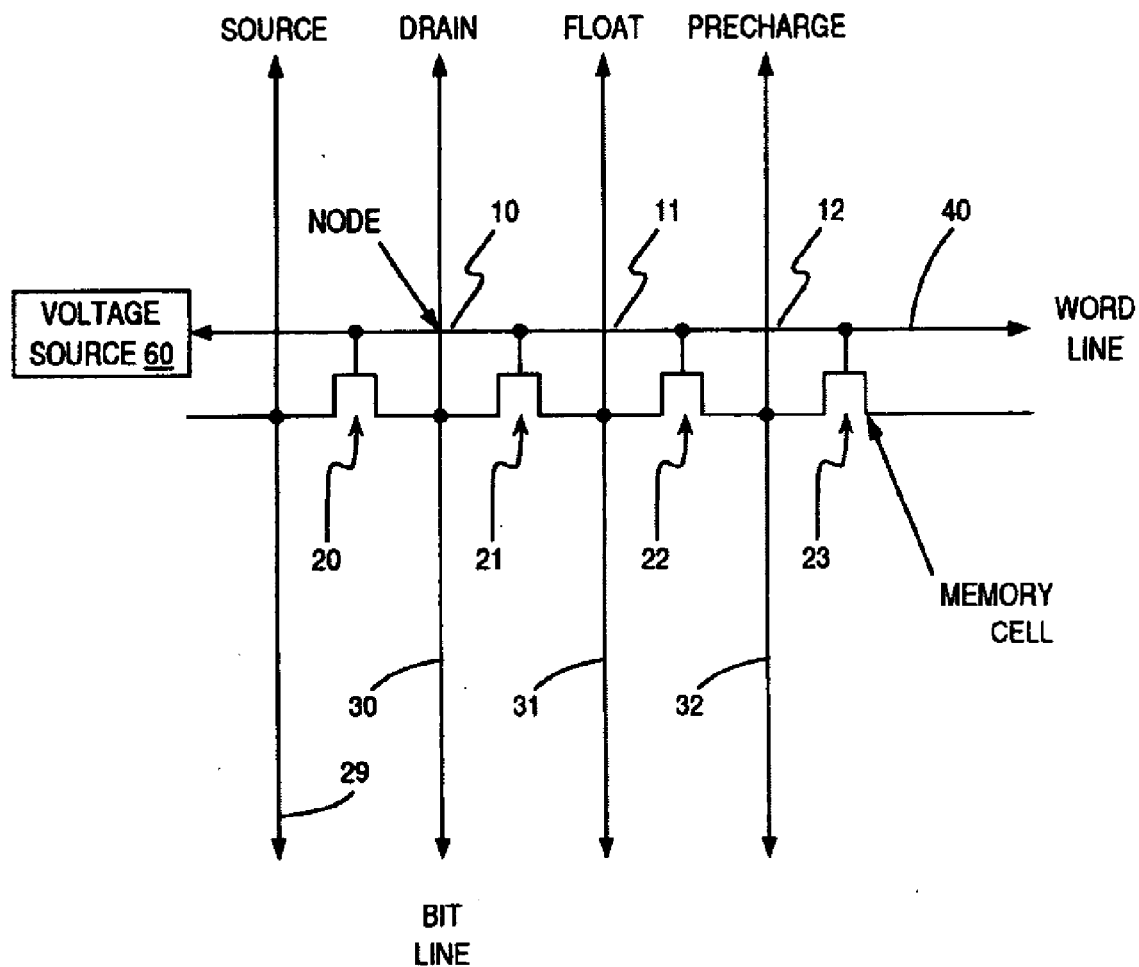
Figure 3B:
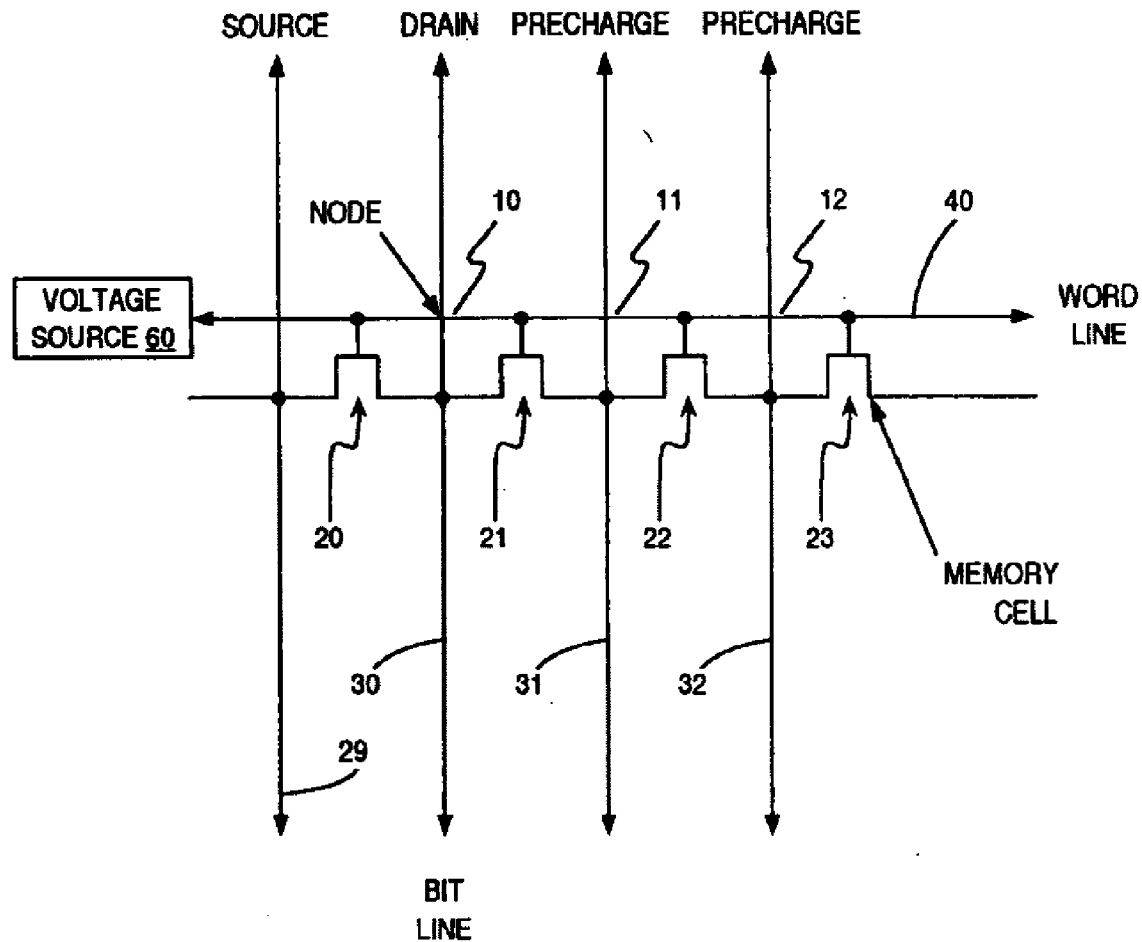

FIG. 4 is a flowchart 400 of a method of reading (or program verifying) a memory cell according to one embodiment of the present invention. Although specific steps are disclosed in flowchart 400, such steps are exemplary. That is, the present invention is well suited to performing various other steps or variations of the steps recited in flowchart 400. It is appreciated that the steps in flowchart 400 may be performed in an order different than presented and that the steps in flowchart 400 are not necessarily performed in the sequence illustrated. In general, steps 410 and 420 of flowchart 400 are performed substantially at the same time, although they may be performed at different times.

In step 410, an electrical load is applied to a first node or bit line (e.g., the drain bit line) corresponding to a selected memory cell to be read (or program verified). This load may be applied using a cascode.

In step 420, a precharge is applied to at least one other (a second) node or bit line on the same word line as the first node or bit line. The second node or bit line is separated from the first node or bit line by at least one intervening node on the same word line, or at least one bit line in the memory array. As described above, more than one bit line (node) may be precharged using a variety of precharge schemes, and the precharge voltage may be the same or different for each of the precharge bit lines (nodes).

By precharging a bit line or node that is separated from the selected memory cell by at least one intervening bit line or node, the amount of leakage current is reduced. Thus, embodiments of the present invention provide a method and device thereof that can reduce and potentially minimize the amount of leakage current between memory cells. Also, using a precharge scheme as described according to the various embodiments of the present invention, it becomes less important to match the precharge voltage with the voltage on the drain line in order to reduce leakage current. In other words, the selection of the precharge voltage can be made with greater latitude. An additional benefit is that the susceptibility of the selected memory cell to variations in precharge voltage is reduced.

The foregoing descriptions of specific embodiments of the present invention have been presented for purposes of illustration and description. They are not intended to be exhaustive or to limit the invention to the precise forms disclosed, and obviously many modifications and variations are possible in light of the above teaching. The embodiments were chosen and described in order to best explain the principles of the invention and its practical application, to thereby enable others skilled in the art to best utilize the invention and various embodiments with various modifications as are suited to the particular use contemplated. It is intended that the scope of the invention be defined by the Claims appended hereto and their equivalents.

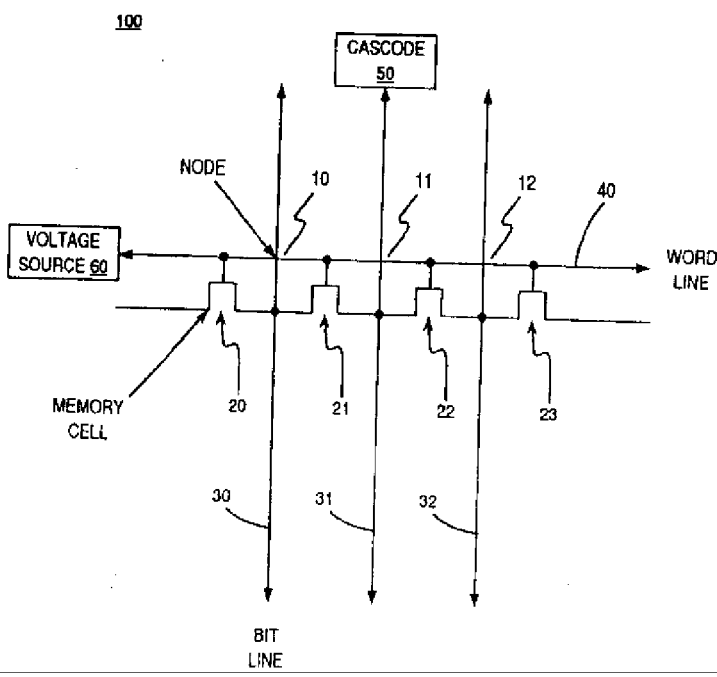

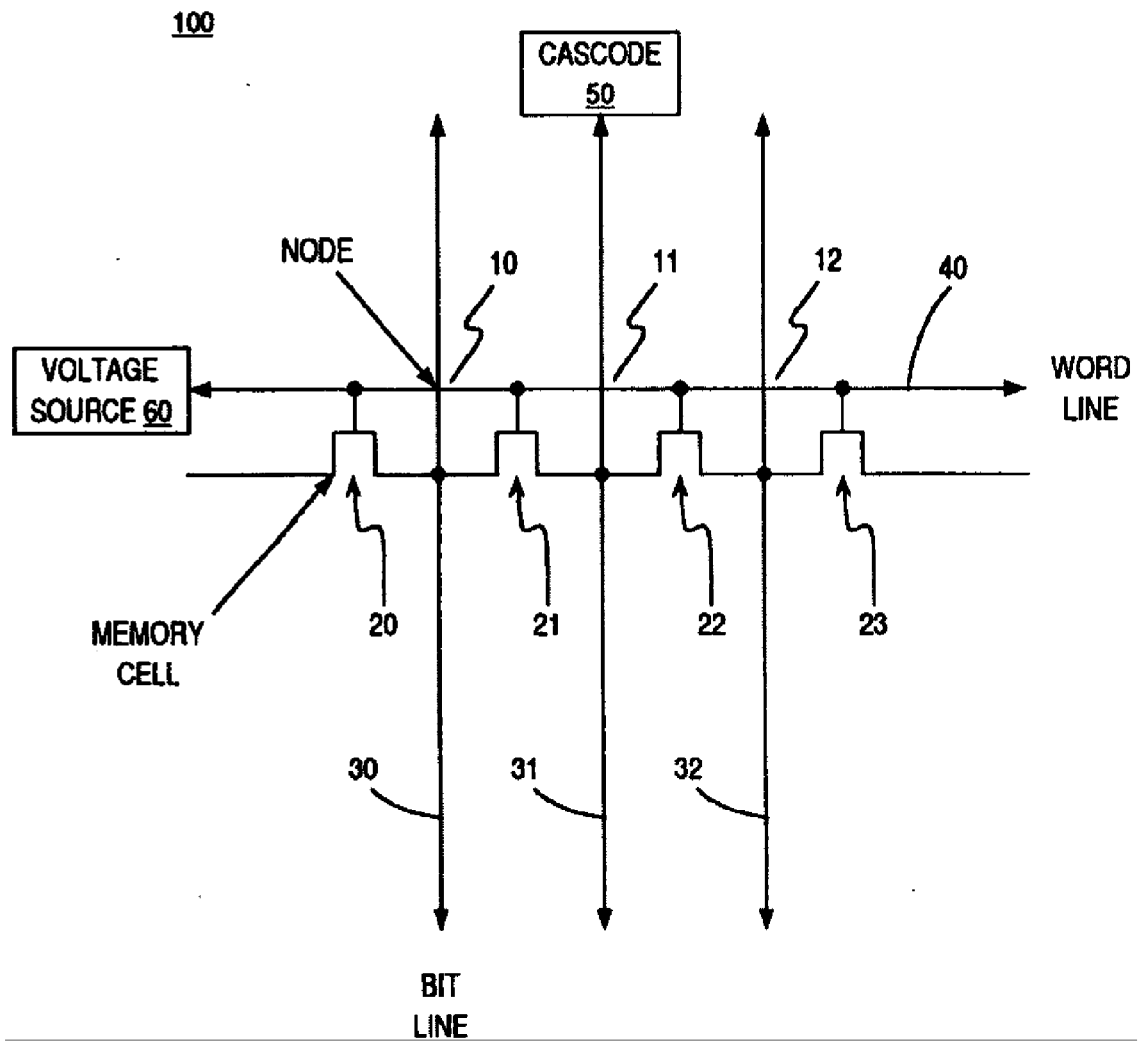

What is claimed is:

1. A method of reading a memory cell in a memory array comprising a plurality of substantially parallel bit lines, said method comprising:

applying an electrical load to a first bit line in said a memory array, said first bit line coupled to said memory cell that is being read, said memory array further comprising a second bit line next to and on one side of said first bit line and a third bit line next to and on the other side of said first bit line; and precharging a fourth bit line in said memory array without precharging said second and third bit lines.

2. The method of claim 1 wherein said fourth bit is in the range of two to five bit lines from said first bit line.

3. The method of claim 1 wherein said precharging comprises:

applying a voltage in the range of 1.2 to 1.5 volts to said fourth bit line.

4. The method of claim 1 wherein said memory cell utilizes a mirror bit architecture wherein two bits of data are stored in said memory cell.

5. The method of claim 1 further comprising:

precharging a fifth bit line in said memory array concurrent with said precharging of said fourth bit line and without precharging said second and third bit lines.

6. The method of claim 5 wherein said fifth bit line lies between said first bit line and said fourth bit line.

7. The method of claim 5 wherein said fourth bit line lies between said first bit line and said fifth bit line.

8. A memory array comprising:

a plurality of substantially parallel bit lines comprising a first bit line, a second bit line next to and on one side of said first bit line, a third bit line next to and on the other side of said first bit line, a fourth bit line on one side of said first bit line, and a fifth bit line on the same side of said first bit line as said fourth bit line;

a word line substantially orthogonal to said bit lines; and a plurality of memory cells coupled to said word line, each memory cell also coupled to two adjoining bit lines, said plurality of memory cells comprising a memory cell being read that is coupled to said first bit line;

wherein an electrical load is applied to said first bit line and wherein a first precharge electrical load is applied to said fourth bit line without precharging said second and third bit lines.

9. The memory array of claim 8 wherein said fourth bit line is in the range of two to five bit lines from said first bit line.

10. The memory array of claim 8 wherein said first precharge electrical load utilizes a voltage in the range of 1.2 to 1.5 volts.

11. The memory array of claim 8 wherein said memory array comprises memory cells utilizing a mirror bit architecture wherein two bits of data are stored in a memory cell.

12. The memory array of claim 8 wherein a second precharge electrical load is applied to said fifth bit line concurrent with said precharging of said fourth bit line and without charging said second and third bit lines.

13. The memory array of claim 12 wherein said first precharge electrical load and said second precharge electrical load utilize different voltages.

14. The memory array of claim 12 wherein said fifth bit line lies between said first bit line and said fourth bit line.

15. The memory array of claim 12 wherein said fourth bit line lies between said first bit line and said fifth bit line.

* * * * *

UNITED STATES PATENT AND TRADEMARK OFFICE
CERTIFICATE OF CORRECTION

PATENT NO. : 6,771,543 B2
DATED : August 3, 2004
INVENTOR(S) : Keith Wong et al.

It is certified that error appears in the above-identified patent and that said Letters Patent is hereby corrected as shown below:

The title page should be deleted and substitute therefore the attached title page as shown on the attached page.

Delete drawings sheets, Figs. 1, 3A and 3B, and substitute therefore the attached drawing sheets consisting of Figs. 1, 3A and 3B as shown on the attached pages.

Signed and Sealed this

Tenth Day of May, 2005

JON W. DUDAS
*Director of the United States Patent and Trademark Office*

(12) United States Patent
Wong et al.

(10) Patent No.: US 6,771,543 B2
(45) Date of Patent: Aug. 3, 2004

(54) PRECHARGING SCHEME FOR READING A MEMORY CELL

(75) Inventors: Keith Wong, San Jose, CA (US); Pau-Ling Chen, Saratoga, CA (US); Michael S. Chung, San Jose, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/226,912

(22) Filed: Aug. 22, 2002

(65) Prior Publication Data
US 2004/0037137 A1 Feb. 26, 2004

(51) Int. Cl.[7] .............................................. G11C 16/06
(52) U.S. Cl. .......................... 365/185.25; 365/185.17; 365/203
(58) Field of Search ........................ 365/185.25, 185.17, 365/203

(56) References Cited

U.S. PATENT DOCUMENTS

| 6,081,456 | A | * | 6/2000 | Dadashev | ............ | 365/185.23 |
| 6,088,265 | A | * | 7/2000 | Ohta | ............ | 365/185.16 |
| 6,487,124 | B2 | * | 11/2002 | Semi | ............ | 365/185.25 |

* cited by examiner

*Primary Examiner*—Hoai Ho

(57) ABSTRACT

A method of reading a memory cell, and a memory array using the method, are described. An electrical load is applied to a first node in the memory array, the first node corresponding to the memory cell. A second node in the memory array, the second node on a same word line as the first node, is precharged. The second node is separated from the first node by at least one intervening node in the same word line.

15 Claims, 5 Drawing Sheets